United States Patent
Fath et al.

(10) Patent No.: US 7,579,837 B2
(45) Date of Patent: Aug. 25, 2009

(54) ARRANGEMENT FOR MAGNETIC FIELD MEASUREMENT

(75) Inventors: Sascha Fath, Uttenreuth (DE); Alexander Granzer, Lauf A.D. Pegnitz (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/128,771

(22) Filed: May 29, 2008

(65) Prior Publication Data

US 2008/0297150 A1    Dec. 4, 2008

(30) Foreign Application Priority Data

May 29, 2007    (DE)    ........... 10 2007 024 910

(51) Int. Cl.
*G01V 3/00*    (2006.01)
(52) U.S. Cl. ........... 324/319; 324/320
(58) Field of Classification Search .......... 324/320, 324/319, 318
See application file for complete search history.

(56) References Cited

U.S. PATENT DOCUMENTS

| | | | |
|---|---|---|---|
| 4,949,044 A * | 8/1990 | Starewicz et al. | 324/320 |
| 5,339,031 A | 8/1994 | Chern | |
| 6,144,196 A | 11/2000 | Tamaki | |
| 6,169,963 B1 * | 1/2001 | Markov | 702/57 |
| 6,362,621 B1 * | 3/2002 | Miyamoto et al. | 324/312 |
| 6,853,185 B2 * | 2/2005 | Tsukamoto et al. | 324/248 |
| 2002/0039030 A1 * | 4/2002 | Khazei | 324/750 |

FOREIGN PATENT DOCUMENTS

GB    2 324 612 A    10/1998

* cited by examiner

*Primary Examiner*—Louis M Arana
(74) *Attorney, Agent, or Firm*—Schiff Hardin LLP

(57) ABSTRACT

The invention concerns an arrangement for magnetic field measurement of a measurement object (in particular a gradient coil in a magnetic resonance apparatus) with a magnetic field sensor that is designed to measure a magnetic field of the measurement object and with a measurement mechanism on which the magnetic field sensor is arranged at a first position. The measurement object has detectable reference points that can be used for calibration of a spatial position of a position sensor. The calibrated position sensor is arranged at a second position of the measurement mechanism, such that, with the first position and the second position, a spatial position relative to the measurement object can be associated with each magnetic field strength that is measured by the magnetic field sensor.

12 Claims, 2 Drawing Sheets

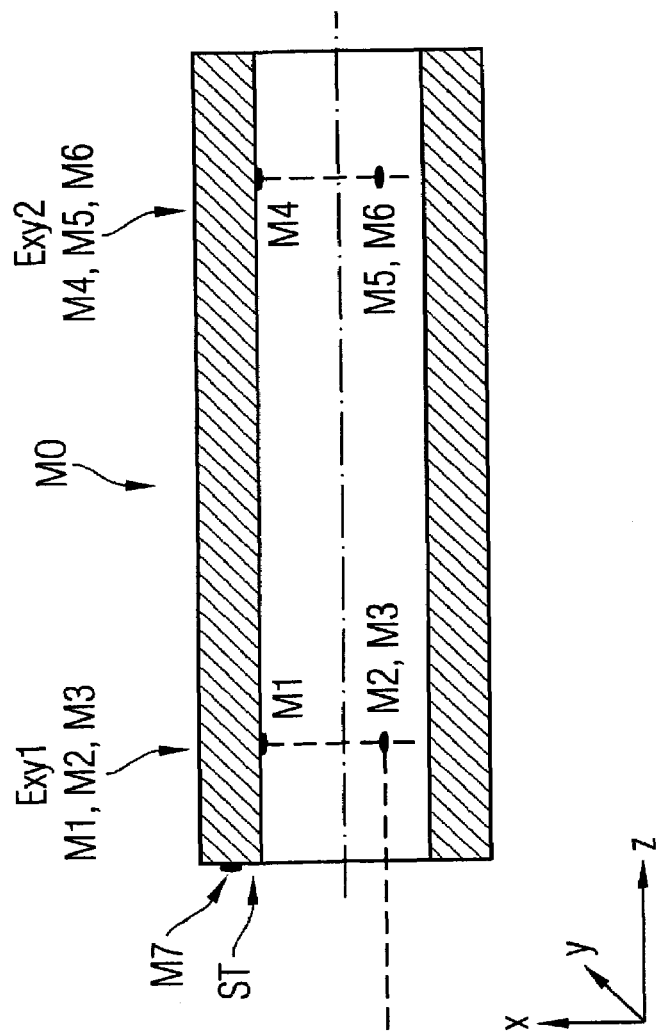
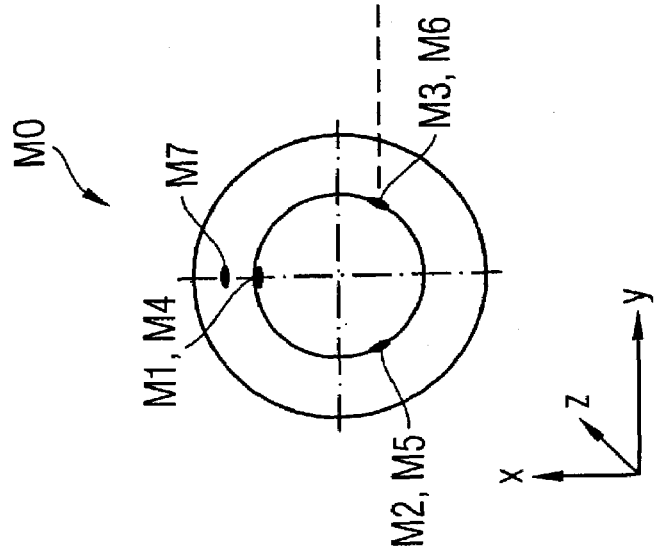

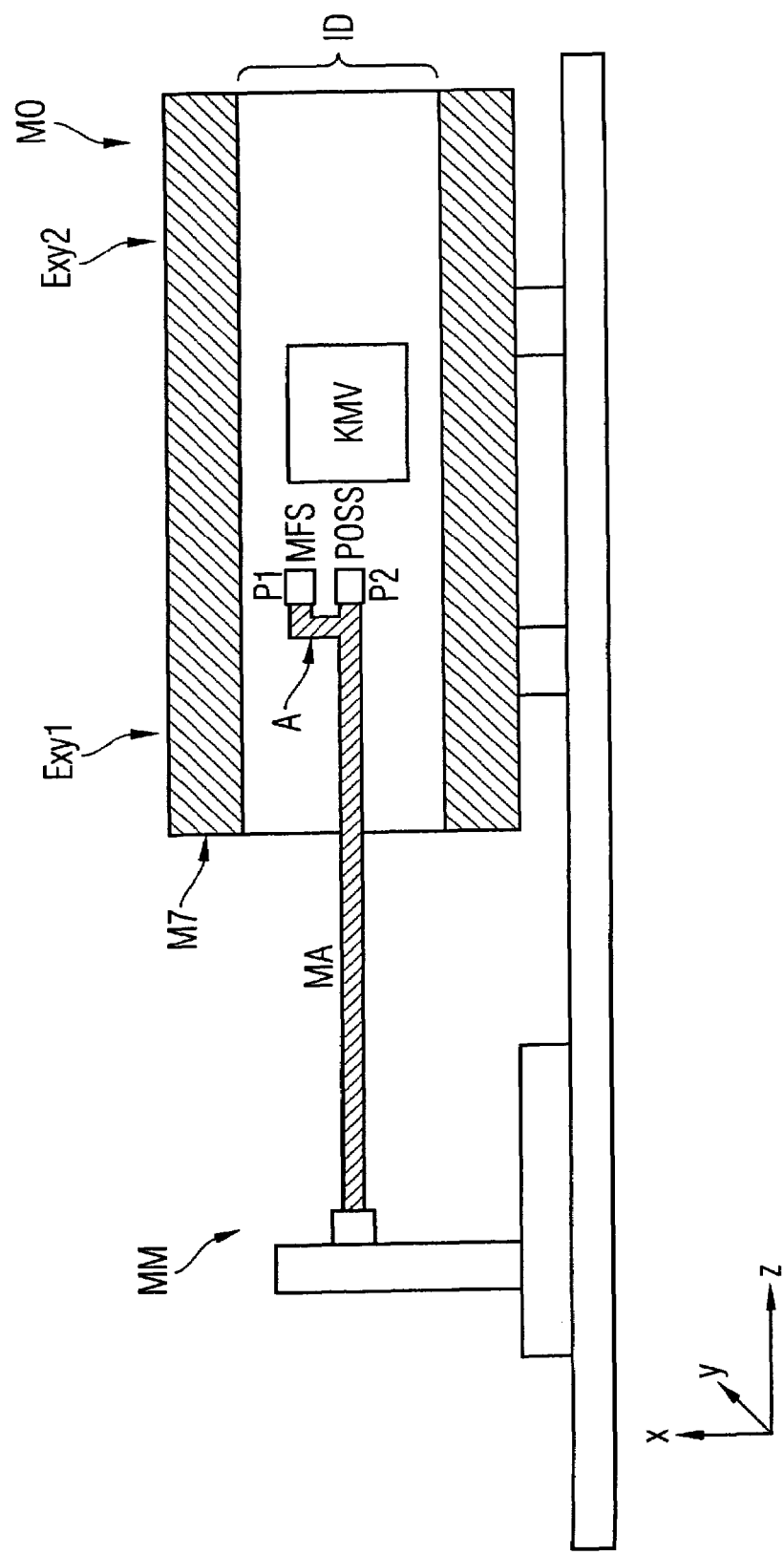

ARRANGEMENT FOR MAGNETIC FIELD MEASUREMENT

BACKGROUND OF THE INVENTION

1. Field of the Invention

The present invention concerns an arrangement for magnetic field measurement of a measurement object, in particular of a gradient coil of a magnetic resonance apparatus.

2. Description of the Prior Art

To measure magnetic fields of a measurement object (for example of a gradient coil of a magnetic resonance apparatus) a measurement mechanism is used that is moved within the gradient coil in order to examine a generally cuboid measurement volume.

A magnetic field sensor is attached to the measurement mechanism for magnetic field measurement. The magnetic field sensor and the (generally cylindrical) gradient coil to be examined are mechanically aligned relative to one another.

The measurement mechanism exhibits a docking plate that is movable with a support rod within the measurement volume and that has a magnetic field sensor attached at a front side thereof via a screw connection.

The alignment of the measurement mechanism on the test item or on the measurement volume, and therefore the precision of the measurement, is dependent to a high degree on the condition and the production tolerances of the front plate as well as on the threading used in the screw connection.

The mechanical alignment of the measurement mechanism and the gradient coil to be tested must be adjusted in an elaborate manual operation and is therefore time-intensive and error-prone.

If there is a general alignment between the sensor and the test item, a tilting or rotation between the measurement mechanism with magnetic field sensor and the test item is possible in all spatial directions.

SUMMARY OF THE INVENTION

An object of the present invention is to provide an arrangement for measurement of magnetic fields of a gradient coil that is improved with regard to the measurement time and the tendency toward error.

A magnetic field sensor that is designed to measure a magnetic field of the measurement object is used in the inventive arrangement for magnetic field measurement of a measurement object, in particular a gradient coil in a magnetic resonance apparatus. Furthermore, a measurement mechanism is provided on which the magnetic field sensor is arranged at a first position. The measurement object possesses detectable reference points that can be used to calibrate a spatial position of a position sensor. The calibrated position sensor is arranged at a second position of the measurement mechanism, such that a spatial position relative to the measurement object can be associated via the first position and via the second position of each magnetic field strength that is measured by the magnetic field sensor.

The previously necessary exact mechanical alignment of the test item relative to the measurement mechanism is no longer necessary due to the arrangement according to the invention, such that the required measurement time is considerably shortened.

Furthermore, a measurement of magnetic fields of the measurement object or test item is enabled with a high spatial resolution.

Due to the arrangement according to the invention, not only is a determination of magnetic fields possible at freely selectable intervals relative to the bounding walls of the gradient coil, but magnetic fields outside of the gradient coil can also be measured.

With the aid of the arrangement according to the invention it is possible to set a coordinate system defined using the determined magnetic field strengths in relation to a mechanical desired coordinate system of the test item.

The actual position of a magnetic field-generating conductive pattern of the gradient coil and a possibly present deviation from a predetermined desired coordinate system can be determined from the measurement of the magnetic field strengths.

BRIEF DESCRIPTION OF THE DRAWINGS

FIGS. 1A and 1B illustrate reference points used for a position determination in the inventive arrangement.

FIG. 2 is a sectional view through an inventive arrangement for magnetic field measurement.

DESCRIPTION OF THE PREFERRED EMBODIMENTS

FIGS. 1A and 1B show reference points M1 through M7 used in the inventive arrangement that can be used for a position determination.

FIG. 1A shows a frontal view of a test item or, respectively, measurement object MO (here a gradient coil) whose magnetic field should be measured. FIG. 1B shows a side view of the measurement object MO in a section presentation.

In total three reference points M1, M2 and M3 lie inside the measurement object MO in a first plane Exy1 that is defined by the coordinate axes x and y. The first plane Exy1 is preferably located in the starting region of the cylindrical measurement object MO.

In total three reference points M4, M5 and M6 lie inside the measurement object in a second plane Exy2 that is defined by the coordinate axes x and y. The second plane Exy2 is preferably located in the end region of the cylindrical measurement object MO.

A seventh reference point M7 is arranged on a facing side ST of the measurement object MO.

In a magnetic field measurement to be implemented the reference points M1 through M7 are used to assign respective x-axis sections, y-axis sections or z-axis sections as respective x-, y- or z-position specifications to measured magnetic field strengths.

In an embodiment the first plane Exy1 also contains the facing side ST, such that the reference points M1 through M3 and M7 respectively lie in the first plane Exy1.

In an advantageous development the reference points M1 through M7 are fashioned for a detection via an optical positioning system (not shown).

FIG. 2 shows an inventive arrangement for magnetic field measurement with the measurement object MO described in FIGS. 1A and 1B.

Magnetic field measurements should be implemented within a predetermined constant measurement volume KMV.

A measurement mechanism possesses a measurement arm MA on which is attached a magnetic field sensor MFS and a position sensor POSS.

The position sensor POSS is preferably attached centrally on an axis of symmetry of the measurement arm MA while the magnetic field sensor MFS is attached on the measurement arm MA with the aid of an extension arm A.

The magnetic field sensor MFS is therefore attached at a first position P1 of the measurement arm MA that is determined by the design or shape and spacing of the extension arm A. The position sensor POSS is correspondingly attached at a second position P2 of the measurement arm MA.

A spatial reference between magnetic field strength (that is measured with the aid of the magnetic field sensor MFS) and the spatial position (that is determined with the use of the position sensor POSS) can be established via the defined positions P1 and P2.

The measurement mechanism MM possesses actuators (not shown in detail here) that enable a movement of the measurement arm MA (and therefore of the sensors attached on it) with up to six degrees of freedom.

In a first step a position calibration is implemented in relation to the measurement object MO.

For example, given an in inner diameter ID of the cylindrical measurement object MO the reference points M1 through M3 of the first plane Exy1 and the reference points M4 through M6 of the second plane Exy2 as well as the last reference point M7 are detected on the facing side of the measurement object MO with the use of the position sensor POSS.

For example, the detection can ensue by scanning or by optical detection.

A unique (unambiguous) association of later measured magnetic field strengths with respective x, y and z spatial coordinates is possible due to the reference points M1 through M7 and due to the previously known positions P1 and P2 of the sensors on the measurement arm MA.

In a preferred embodiment the position sensor POSS is removed from the measurement arm MA before the determination of the magnetic field strengths in order to preclude a disruption of the magnetic field measurements.

As an alternative, it is possible to alternately arrange the position sensor POSS and the magnetic field sensor MFS at an identical position such that the first position P1 and the second position P2 correspond.

In a second step the magnetic field sensor MFS is now moved in the x-, y- and z-direction in order to implement the magnetic field measurements from this point on.

In a preferred embodiment the position sensor POSS is designed as an optical detection system in order to be able to optically detect the reference points M1 through M7.

The measurement mechanism, in particular the measurement arm MA, is produced from non-magnetic and non-electrically conductive material.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement for making a magnetic field measurement of a measurement object, comprising:

a magnetic field sensor configured to measure a magnetic field of a measurement object;

a measurement mechanism that positions said magnetic field sensor at a first position;

a plurality of detectable reference indentifiers configured for placement on said measurement object;

a position sensor that interacts with said detectable reference identifiers to calibrate a spatial position of said position sensor, said position sensor being arranged at a second position on said measurement mechanism; and a processor that, based on knowledge of said first position and said second position, associates a spatial position relative to the measurement object with each magnetic field strength of the measurement object that is measured by the magnetic field sensor.

2. An arrangement as claimed in claim 1 wherein said detectable reference identifies are optically detectable by said position sensor.

3. An arrangement as claimed in claim 1 wherein said measurement mechanism comprises a measurement arm on which said magnetic field sensor is mounted.

4. An arrangement as claimed in claim 3 wherein said position sensor is mounted directly on said measurement arm, and wherein said measurement arm comprises an arm extension on which said magnetic field sensor is mounted.

5. An arrangement as claimed in claim 4 wherein said measurement mechanism comprises a movement mechanism that moves said measurement arm to enable movement of at least one of said magnetic field sensor and said position sensor in up to 6° of freedom.

6. An arrangement as claimed in claim 1 wherein said position sensor is detachably fixed to said measurement mechanism to allow removal of said position sensor after calibration thereof.

7. An arrangement as claimed in claim 1 comprising three of said detectable reference identifiers, and wherein said processor determines spatial coordinates within a common plane from said three reference identifiers.

8. An arrangement as claimed in claim 7 wherein said measurement object has a cylindrical shape, and wherein said three reference identifiers designate a first plane in a first region of said cylinder and comprising three further reference identifiers that define a second plane at an end region of said cylinder.

9. An arrangement as claimed in claim 8 comprising a reference identifier located at a facing side of said cylindrical measurement object.

10. An arrangement as claimed in claim 1 wherein said measurement object is a gradient coil of a magnetic resonance apparatus.

11. An arrangement as claimed in claim 1 wherein said first position of said magnetic field sensor and said second position of said position sensor are identical.

12. An arrangement as claimed in claim 1 wherein said measurement mechanism is comprised of non-magnetic and non-electrically conductive material.

* * * * *